United States Patent
Bacher et al.

(10) Patent No.: US 10,502,777 B2
(45) Date of Patent: Dec. 10, 2019

(54) ELECTRONIC CIRCUIT TESTING METHOD AND DEVICE

(71) Applicant: STMICROELECTRONICS (ROUSSET) SAS, Rousset (FR)

(72) Inventors: Yann Bacher, Rousset (FR); Nicolas Froidevaux, Aix en Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/184,859

(22) Filed: Nov. 8, 2018

(65) Prior Publication Data
US 2019/0146029 A1   May 16, 2019

(30) Foreign Application Priority Data
Nov. 10, 2017   (FR) ..................................... 17 60591

(51) Int. Cl.
| G06F 19/00 | (2018.01) |
| H04B 17/00 | (2015.01) |
| G01R 31/28 | (2006.01) |
| H04B 17/10 | (2015.01) |

(52) U.S. Cl.
CPC ......... G01R 31/2822 (2013.01); H04B 17/10 (2015.01)

(58) Field of Classification Search
CPC .. H06F 19/00; H04B 1/26; H04B 1/16; H04B 17/00; H04B 17/17; H01L 23/00
See application file for complete search history.

(56) References Cited

U.S. PATENT DOCUMENTS

| 9,059,189 B2 * | 6/2015 | Keller, III | H01L 23/576 |
| 9,851,386 B2 * | 12/2017 | Keller, III | G06F 21/73 |
| 9,887,721 B2 * | 2/2018 | Keller, III | H01L 23/576 |
| 9,959,430 B2 * | 5/2018 | Hamilton | G06F 21/73 |
| 2005/0151648 A1 * | 7/2005 | Nakazawa | G06K 7/0008 340/572.1 |
| 2009/0099830 A1 * | 4/2009 | Gross | G06K 9/6271 703/14 |
| 2010/0237854 A1 * | 9/2010 | Kumhyr | G01R 33/10 324/750.3 |
| 2010/0305892 A1 * | 12/2010 | Gross | H01Q 21/205 702/66 |
| 2012/0160914 A1 * | 6/2012 | Fratti | G06K 19/07758 235/381 |
| 2012/0179812 A1 * | 7/2012 | Keller, III | F41A 17/06 709/224 |
| 2012/0226463 A1 | 9/2012 | Keller, III et al. | |
| 2014/0379286 A1 | 12/2014 | Horng et al. | |
| 2016/0098561 A1 | 4/2016 | Keller et al. | |
| 2016/0112083 A1 * | 4/2016 | Keller, III | H01L 23/576 375/316 |
| 2016/0282394 A1 * | 9/2016 | House | G06K 9/6276 |

* cited by examiner

*Primary Examiner* — Blane J Jackson
(74) *Attorney, Agent, or Firm* — Seed Intellectual Property Law Group LLP

(57) ABSTRACT

A method of testing a first circuit, including: a) applying a first signal between two terminals of the first circuit, the first circuit being powered off; and b) verifying that radio frequency waves transmitted by the first circuit correspond to an expected transmission.

20 Claims, 3 Drawing Sheets

ELECTRONIC CIRCUIT TESTING METHOD AND DEVICE

CROSS-REFERENCE TO RELATED APPLICATION(S)

This application claims the priority benefit of French Patent Application No. 17/60591, filed Nov. 10, 2017, the content of which is hereby incorporated by reference in its entirety to the maximum extent allowable by law.

BACKGROUND

Technical Field

The present disclosure relates to electronic circuits and, in particular, to an electronic circuit testing method and device.

Description of the Related Art

After having manufactured an electronic circuit such as an integrated circuit, tests intended to verify that the circuit is capable of operating, in particular that its inner connections are correct, are generally carried out.

However, when the circuit comprises inner connections which are difficult to access from the outside of the circuit, testing these connections raises various implementation and reliability issues. Such issues might result in false validations or in false rejections.

BRIEF SUMMARY

An embodiment provides overcoming all or part of the disadvantages of usual test methods.

Thus, an embodiment provides a method of testing a first circuit, comprising: a) applying a first signal between two terminals of the first circuit, the first circuit being powered off; and b) verifying that radio frequency waves transmitted by the first circuit correspond to an expected transmission.

According to an embodiment, only the first signal is applied to the first circuit.

According to an embodiment, the first signal varies over time.

According to an embodiment, the two terminals are terminals of application of a DC voltage or of a power supply voltage.

According to an embodiment, the first circuit is an integrated circuit comprising a chip in a package.

According to an embodiment, the first signal comprises at least one edge.

According to an embodiment, step b) comprises: c) simultaneously to step a), capturing said radio frequency waves; d) deducing from step c) a radio frequency signature of the circuit to be tested; and e) determining the result of the test by verifying whether said signature corresponds to a reference signature.

According to an embodiment, the first signal has one or a plurality of first frequencies, for each of which: the radio frequency signature comprises a first value and the reference signature comprises a second value; and step e) comprises comparing with a threshold a difference in absolute value between the first value and the second value.

According to an embodiment, for each of the first frequency(ies), the first value is representative of an intensity obtained at step b) by a bandpass filtering centered on the first frequency.

According to an embodiment, the first signal has a frequency variable over time and, for each first frequency, the first value is representative of an intensity of the second signal at a time when the frequency of the first signal is the first frequency.

According to an embodiment, the method further comprises, before step e): f) applying to two terminals of a second circuit a second signal having the first frequency(ies); g) simultaneously to step f), capturing radio frequency waves transmitted by the second circuit; and h) deducing from step g) the second values.

According to an embodiment, the method further comprises, before step e): i) applying to a third circuit a third signal having a frequency covering a frequency range; j) simultaneously to step i), capturing radio frequency waves transmitted by the third circuit; and k) selecting the first frequencies from among frequencies corresponding to maximum intensities of the waves captured at step i).

Another embodiment provides test devices capable of implementing the above method.

According to an embodiment, the device comprises: a source configured to supply the first signal between two terminals of the source; two contact elements connected to the two terminals of the source, configured to be in electric contact with said two terminals of the first circuit; an antenna arranged to capture said radio frequency waves transmitted by the first circuit; and a fourth circuit connected to the antenna and configured to verify that said radio frequency waves transmitted by the first circuit correspond to an expected transmission.

According to an embodiment, the device comprises an integrated circuit support comprising the two contact elements.

According to an embodiment, the first signal has one or a plurality of first frequencies, and the fourth circuit comprises, for each first frequency, an element of bandpass filtering according to the first frequency, the filtering element being connected to the antenna.

The foregoing and other features and advantages will be discussed in detail in the following non-limiting description of specific embodiments in connection with the accompanying drawings.

DETAILED DESCRIPTION

Figure 1:
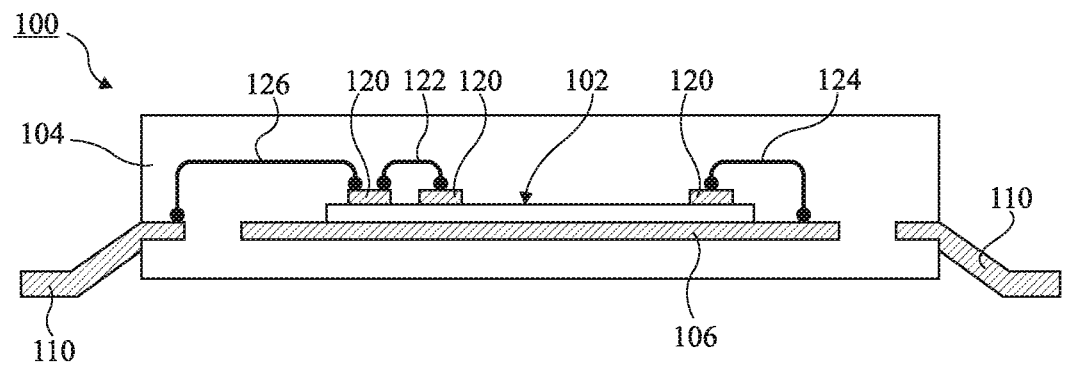
FIG. 1 is a simplified cross-section view of an integrated circuit.

The same elements have been designated with the same reference numerals in the various drawings and, further, the various drawings are not to scale. For clarity, only those steps and elements which are useful to the understanding of the described embodiments have been shown and are detailed. In particular, the operation of the tested circuit has not been detailed, the described embodiments being applicable to any usual circuit.

In the following description, when reference is made to terms qualifying an absolute position, such as terms "front," "back," "top," "bottom," "right," "left," etc. or a relative position, such as terms "above," "under," "upper," "lower," etc., reference is made to the orientation of the concerned element in the concerned drawings, it being understood that, in practice, the described devices may have a different orientation. Unless otherwise specified, expressions "approximately," "substantially," "in the order of," and "about" mean to within 10%, preferably to within 5%.

FIG. 1 is a simplified cross-section view of an integrated circuit 100. Integrated circuit 100 typically comprises an electronic chip 102 in a package 104.

Chip 102 is arranged on a conductive plane 106 and is connected, for example, by welded wires, to peripheral pins 110. The assembly is encapsulated, for example, in epoxy resin which forms package 104.

Chip 102 comprises, at its upper surface, connection pads 120. A plurality of pads 120 may be interconnected by connections 122. One or a plurality of pads 120 may be connected to conductive plane 106 by connections 124, and/or to pins 110 by connections 126. Although a single connection 122, a single connection 124, and a single connection 126 have been shown, the integrated circuit comprises in practice a plurality of connections 122, 124, or 126, or even several tens of such connections. Each connection 122, 124, or 126 for example comprises a conductive wire welded or soldered at its two ends to pads 120, and/or to pins 110 or conductive plane 106.

Pins 110 form terminals of the integrated circuit accessible from the outside of package 104. The integrated circuit typically comprises, among pins 110, at least two terminals of application of a power supply voltage. As an example, the power supply voltage is then applied to the chip via two connections 126, and is distributed at various locations of chip 102 via connections 122 and connections 124. As a variation, a terminal of the circuit, typically a terminal connected to conductive plane 106, may be accessible from the outside from the lower surface of the package.

After the manufacturing of an integrated circuit of the type of circuit 100, some of connections 122, 124, or 126 may be defective (for example, poorly welded, cut, etc.). The circuit risks not being usable. According to the example where a connection 122 is provided to distribute the power supply voltage in the chip, if the connection is defective, circuit 100 risks not having the desired performance or rapidity level.

It is provided to perform a test enabling to detect the possible presence of a defect in circuit 100. More particularly, it is provided to test the circuit when it is not powered. To achieve this, a predefined signal varying over time, for example, a radio frequency signal, is applied between two pins 110 of circuit 100 which are not intended for the application of such a signal in normal use. The signal is preferably a multi-frequency signal. This causes the transmission, by circuit 100, of radio frequency electromagnetic waves which are captured from the outside of circuit 100.

The inventors have observed that the radio frequency waves thus transmitted by the circuit depend on the presence or on the absence of a defect in the circuit. If the circuit has a defect such as a defective inner connection, it is provided to detect this defect by verifying that the captured waves correspond to those which are expected from a defect-free circuit.

Figure 2:
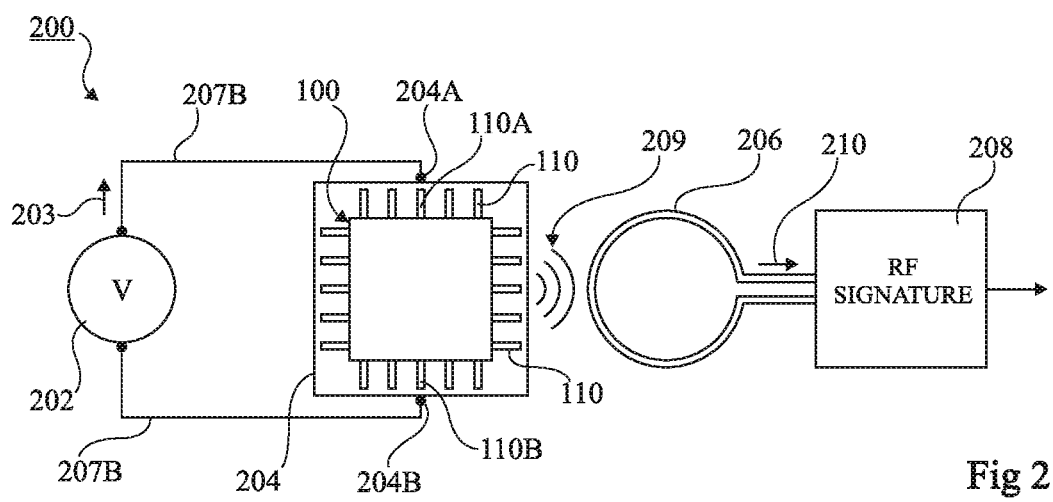
FIG. 2 schematically illustrates an embodiment of a circuit testing device.

FIG. 2 schematically illustrates an embodiment of a device 200 for testing a circuit 100.

Test device 200 comprises a source 202 of a signal 203 varying over time, an element 204 capable of receiving circuit 100, and an antenna 206.

In the example where circuit 100 is an integrated circuit of the type of that in FIG. 1, element 204 may be an integrated circuit support. Support 204 has two terminals 204A and 204B electrically connected to the terminals of source 202 by conductors 207A and 207B. When integrated circuit 100 is in place, terminals 204A and 204B are in electric contact with pins 110A and 110B of circuit 100. Pins 110A and 110B are then connected by electric conductors to the terminals of source 202.

An advantage of the integrated circuit support is that it enables, to test successive integrated circuits 100, to easily arrange each circuit 100 in a same predefined position relative to antenna 206 and to easily remove it once tested.

Circuit 100 may be any electronic circuit where the presence of a possible defect is desired to be detected. It will be within the abilities of those skilled in the art to design an element 204 capable of cooperating with the circuit to be tested, for example enabling to place the circuit to be tested in a predefined position relative to antenna 206 and to easily remove it after the test. In particular, the function of terminals 204A and 204B may be fulfilled by elements configured to form contacts with terminals of the circuit to be tested, such as points, the contact elements being connected to the terminals of source 202.

The test device further comprises a processing circuit 208 (RF SIGNATURE) connected to antenna 206. Processing circuit 208 for example comprises a memory containing a program, and a component capable of executing the program, such as a microprocessor.

As an example, element 204 and antenna 206 are arranged on a printed circuit board (PCB), not shown. The antenna may be a track of the printed circuit, for example, loop-shaped.

In operation, signal 203 supplied by source 202 is applied to terminals 110A and 110B of circuit 100. Preferably, signal 203 is such that the voltage values between terminals 110A and 110B remain smaller than the value of the power supply voltage of circuit 100 in normal use, for example, smaller than approximately 50%, for example, than 50%, or even than approximately 20%, for example, than 20%, of the value of the power supply voltage in normal use. Preferably, signal 203 is such that the voltage values between terminals 110A and 110B remain smaller than a diode voltage of the circuit, for example, smaller than approximately 0.5 V, for example, than 0.5 V. Signal 203 is for example such that the maximum value of the voltage between terminals 110A and 110B is greater than approximately 50%, for example, than 50%, of the power supply voltage. Signal 203 is for example such that the voltage between terminals 110A and 110B successively takes positive and negative values, or for example such that the voltage between terminals 110A and 110B successively takes the zero value and positive values, or also for example such that the voltage between terminals 110A and 110B successively takes the zero value, positive values, and negative values.

It should be noted that terminals 110A and 110B may any of the terminals of circuit 100. Preferably, terminals 110A and 110B are terminals of application, in normal use when no test is going on, of a DC voltage or of a power supply voltage. However, in the example where terminals 110A and 110B are terminals of application of a power supply voltage in normal use, signal 203 applied to terminals 110A and 110B does not correspond to this power supply voltage. Signal 203 may then correspond to a voltage having a value for example smaller than approximately 50%, for example, than 50%, preferably smaller than approximately 20%, for example, than 20%, of the value of this power supply voltage, or smaller than a diode voltage value. Signal 203 may further have frequencies more than approximately 100 times, for example, more than 100 times, preferably more than approximately 1,000 times, for example, more than 1,000 times, greater than those of this power supply voltage.

Signal 203 plays the role of an excitation signal which causes the transmission of radio frequency waves 209 by circuit 100. These waves are captured by antenna 206 and correspond to a signal 210 across the antenna. As an example, processing circuit 208 determines, from signal 210, a radio frequency signature of circuit 100. The radio frequency signature for example comprises elements of the frequency spectrum and/or of the spatial distribution of the radio waves transmitted by circuit 100. Processing circuit 208 detects a difference between the radio frequency signature of circuit 100 and a reference signature, for example, the signature of a defect-free circuit. Examples of a processing circuit 208, of its operation, and of the radio frequency signatures are described hereafter in relation with FIGS. 3 and 4A to 4C.

Figure 3:
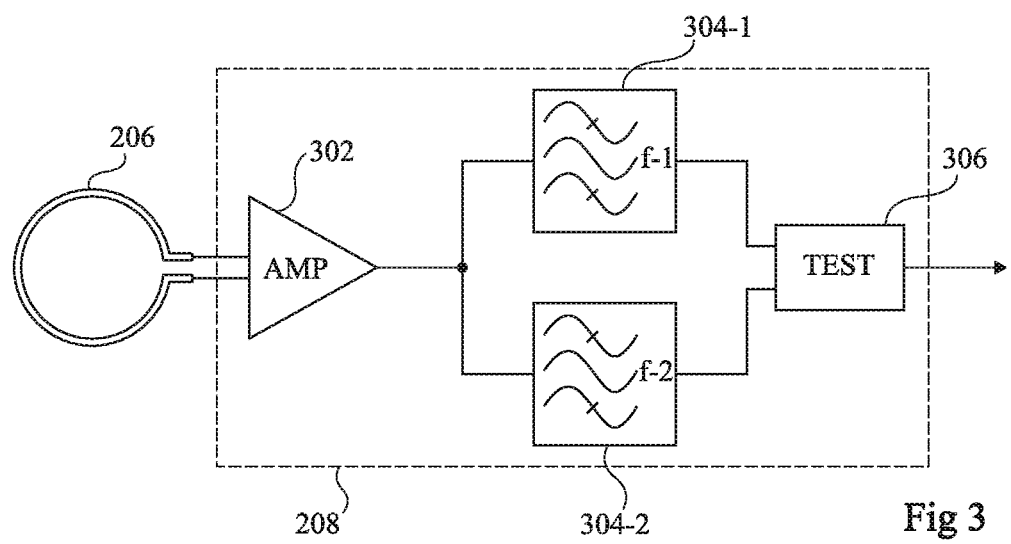
FIG. 3 schematically illustrates an example of a processing circuit of the test device of FIG. 2.

FIG. 3 schematically illustrates an example of a processing circuit 208 of a device of the type in FIG. 2, connected to antenna 206.

Processing circuit 208 for example comprises a radio frequency amplifier 302 (AMP) connected to antenna 206. Processing circuit 208 further comprises N bandpass filters 304-$i$, i taking the values between 1 and N, having respective central frequencies f-i (N=2 in the shown example). Although two bandpass filters have been provided in the shown example, any number of bandpass filters may be provided. The frequencies of the bandpass filter(s) are selected from a radio frequency range for example extending between approximately 1 MHz and approximately 10 GHz, for example between 1 MHz and 10 GHz, preferably between approximately 10 MHz and approximately 3 GHz, for example, between 10 MHz and 3 GHz. An example of a way of selecting frequencies f-i will be described hereafter in relation with FIGS. 5A and 5B.

Each of the bandpass filters has its input connected to the output of amplifier 302. A circuit 306 (TEST) is connected to the outputs of the bandpass filters and is configured to supply the result of the test. An example of operation of circuit 306 will be described hereafter in relation with FIG. 4B.

Figure 4A:
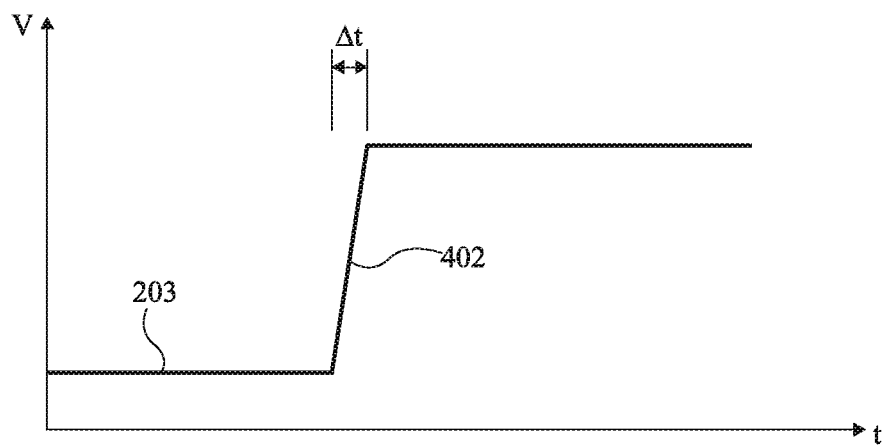
FIG. 4A schematically illustrates an example of a signal implemented in the test device of FIG. 2.

FIG. 4A schematically illustrates an example of a signal 203 over time, for example corresponding to a voltage V supplied by source 202 of the device of FIG. 2.

In this example, excitation signal 203 has a rising edge 402. Duration Δt of rising edge 402 is sufficiently short to find frequencies f-i of bandpass filter(s) 304-$i$ among the frequencies of signal 203. Duration Δt is for example shorter than approximately 150 ps. According to an advantage, the source of such a signal is particularly simple to form.

As a variation, excitation signal 203 may have a falling edge, having a duration for example shorter than 150 ps, or a succession of rising and falling edges having durations for example shorter than 150 ps. For example, signal 203 could be a square-pulse signal.

Figure 4B:
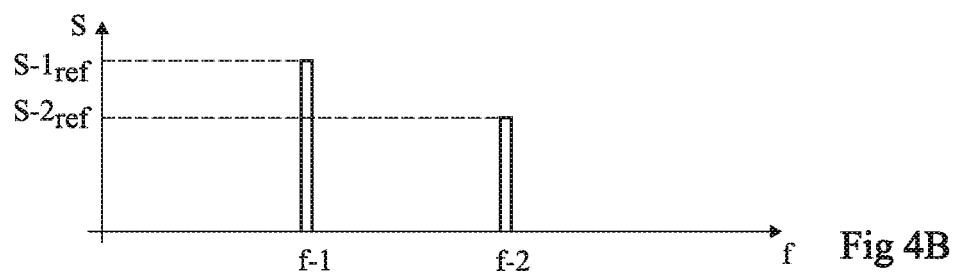
FIGS. 4B and 4C each schematically illustrate an example of a frequency response of a circuit submitted to the signal of FIG. 4A.

FIG. 4B schematically illustrates a frequency response of a defect-free circuit 100 submitted to signal 203 of FIG. 4A, obtained by processing circuit 208 of FIG. 3 and corresponding to a radio frequency signature.

The signature comprises, for each of frequencies f-i, a value S-i representative of the intensity of a filtered signal supplied by the corresponding bandpass filter. Each of values S-i may for example be an average intensity or the peak intensity of the filtered signal or, for example, an amplitude or a peak value of the filtered signal. As an example, the bandwidth at −3 dB of each bandpass filter is in the range from approximately 100 kHz to approximately 10 MHz, for example, from 100 kHz to 10 MHz.

Circuit 306 verifies that the radio frequency signature of circuit 100 corresponds to a reference signature. The reference signature corresponds to the radio frequency signature of defect-free circuit 100. Values, S-1, S-N correspond to reference values, respectively S-$1_{ref}$, ..., S-$N_{ref}$.

As an example, to obtain the reference signature, a circuit 100 which is known to be defect-free, or reference circuit, may be used in the test device of FIG. 2 instead of the circuit to be tested, and circuit 208 of the test device may be provided to be configured to supply the reference signature.

As a variation, the reference signature may be obtained by any device configured to apply an excitation signal to a reference circuit and to supply the signature of the reference circuit from radio frequency waves captured by an antenna. The reference circuit and the antenna used to determine the reference signature are preferably arranged in the same way as circuit 100 to be tested and the antenna used to test circuit 100 to be tested. Preferably, when the reference signature is determined, the excitation signal 203 applied to circuit 100 during the test is identical to the excitation signal applied to the reference circuit. Preferably, when the reference signature is determined, the terminals of the reference circuit having the excitation signal applied thereto correspond, in the circuit to be tested, to the terminals having excitation signal 203 applied thereto during the test.

Figure 4C:
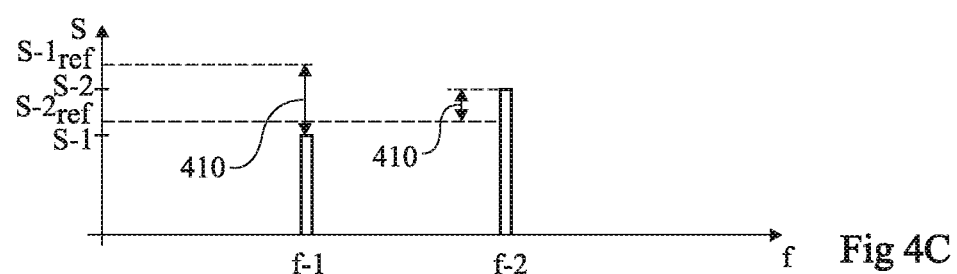

FIG. 4C schematically illustrates a frequency response of a defective circuit 100 submitted to signal 203 of FIG. 4A, obtained by the processing circuit of FIG. 3. One at least of values S-i differs from the corresponding value S-$i_{ref}$.

To detect the presence of a defect in circuit 100, circuit 306 determines, for each of frequencies f-i, difference 410 in absolute value of value S-i of the signature of circuit 100 with the corresponding reference value S-$i_{ref}$. Circuit 306 compares difference 410 with a threshold associated with each of frequencies f-i. A defect in circuit 100 is detected when at least one of differences 410 is greater than the associated threshold.

As an example, to define each threshold, an assembly of defect-free circuits 100 is provided. For each of these circuits, the reference signature is determined, for example, as described hereinabove in relation with FIG. 4B. For each of frequencies f-i, the associated threshold can then be determined according to the statistical standard deviation of reference value S-$i_{ref}$ in the various reference signatures, for example, the threshold is the standard deviation multiplied by a value, for example, greater than 3. As a variation, the threshold may be a value smaller than or equal to approximately 10% of the associated reference value S-$i_{ref}$.

Although a specific circuit 208 designed to obtain a radio frequency signature having a value for each of frequencies f-i has been described hereinabove in relation with FIGS. 3 and 4A to 4C, circuit 208 may be designed to obtain such a radio frequency signature in any other adapted manner, for example by applying to circuit 100 an excitation signal 203 successively having frequencies f-i and by determining for each of frequencies f-i a value representative of the intensity of the waves captured by the antenna at the time when radio frequency signal 203 has the considered frequency.

Figure 5A:
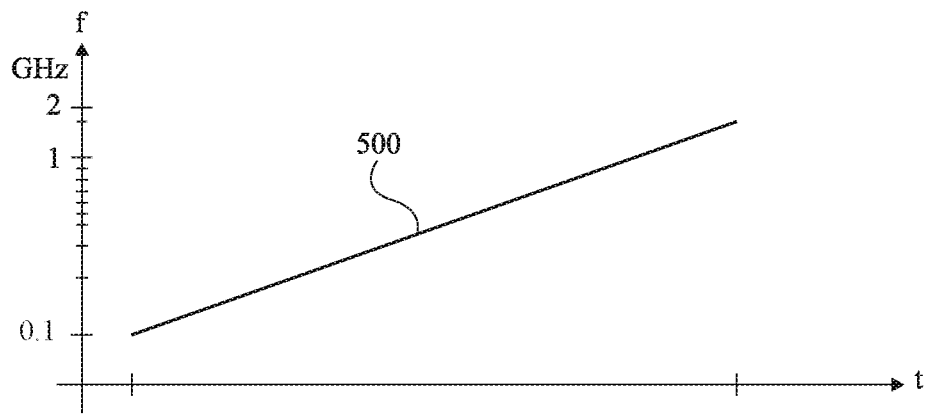
FIGS. 5A to 5C illustrates a mode of selection of frequencies for exciting a circuit for test purposes.
Figure 5B:
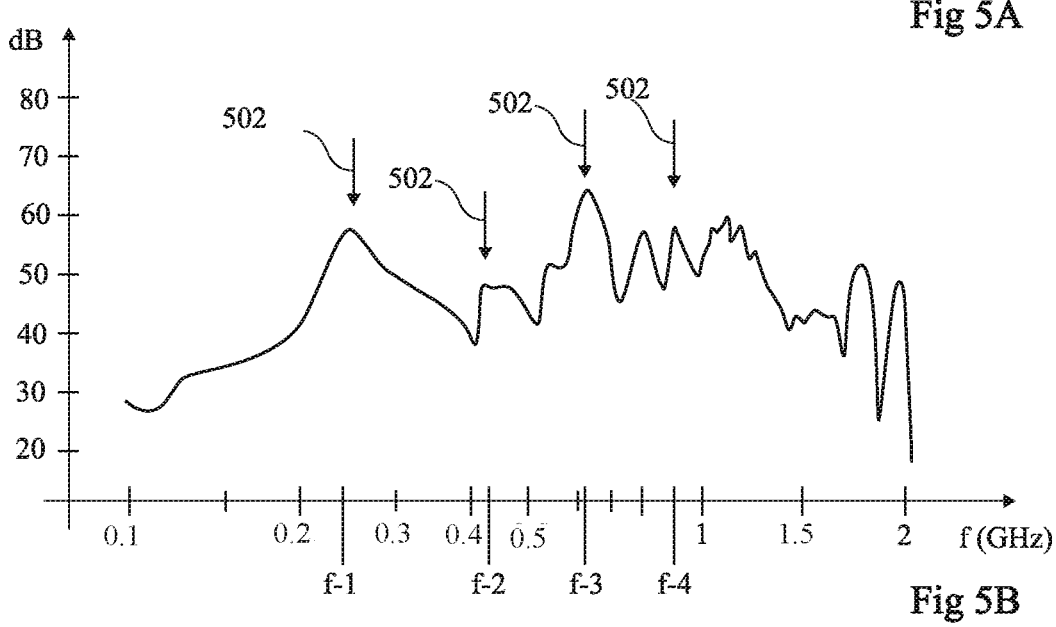
Figure 5C:
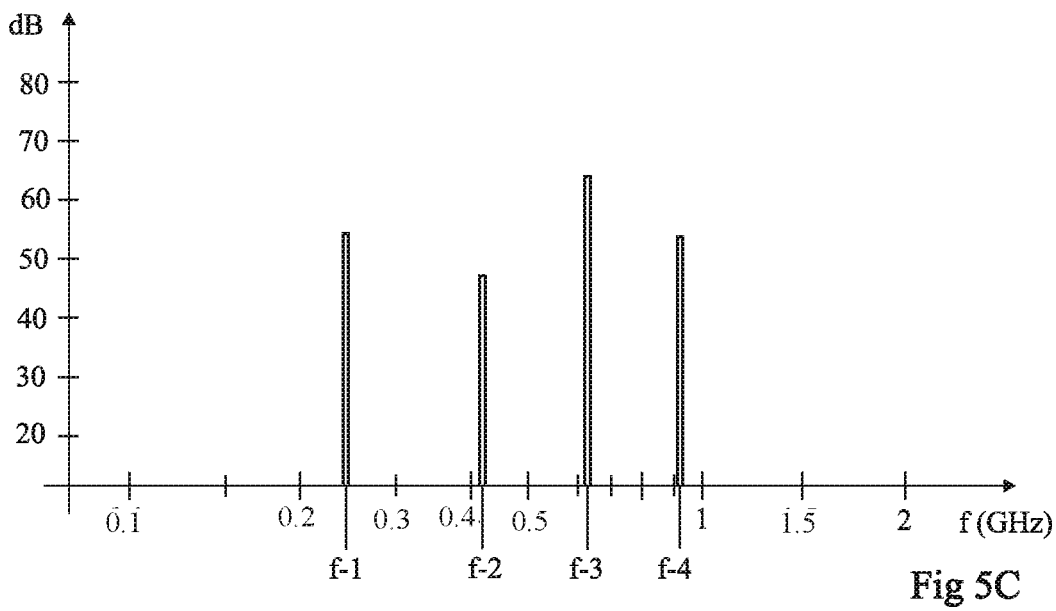

FIGS. 5A to 5C illustrate an example of steps enabling to select the excitation frequencies f-1, . . . , f-N of signal 203. These frequencies correspond to those of bandpass filters 304-1, . . . , 304-N in the example of circuit 208 of FIG. 3.

FIG. 5A shows frequency f according to time t of a radio frequency signal 500, for example, a sinusoidal signal having a variable frequency. As an example, frequency f covers a frequency range for example extending from 100 MHz to 2 GHz. As a variation, frequency f may also be decreasing, or exhibit any variations enabling to the frequency to successively take the various values of the frequency range.

It is started by applying radio frequency signal 500 to a reference circuit, for example, on two terminals of application of a power supply voltage of the reference circuit. Radio frequency waves then transmitted by the reference circuit are captured by an antenna. The intensity of the waves captured by the antenna along time is measured, while the frequency of the applied radio frequency signal 500 successively takes the various values of the frequency range. The intensity of the captured waves can then be deduced for each frequency.

FIG. 5B shows an example of intensity of the captured waves, according to frequency f of radio frequency signal 500 applied to the reference circuit. The intensity of the captured waves has maximum values 502 for certain values of frequency f.

The frequencies f-i are selected among those corresponding to maximum values 502. In the shown example, 4 frequencies f-1, f-2, f-3, f-4 are selected. FIG. 5C schematically shows a reference signature for example obtained in the same way as the signature of FIG. 4B, the frequencies of the N bandpass filters 304-i being the frequencies f-i selected at the step of FIG. 5C.

An advantage is that the frequency and the intensity of maximum values 502 strongly depend on the presence or on the absence of defects in circuit 100 to be tested. Thus, due to the fact that frequencies f-i are selected from among the frequencies of maximum values 502, the test is particularly sensitive and reliable.

Specific embodiments have been described. Various alterations, modifications, and improvements will readily occur to those skilled in the art. In particular, one may use, instead of the signal of FIG. 4A, a radio frequency signal of the type in FIG. 5A, having a variable frequency and covering a frequency range. The radio frequency signature can then be obtained by determining, for each of frequencies f-i of the scanned range, a value representative of the intensity of the waves captured by the antenna at the time when the radio frequency signal has the considered frequency.

Further, the antenna may be located in a plane different from that of the printed circuit, for example, perpendicular to the printed circuit. A plurality of antennas having different positions and/or orientations relative to the circuit to be tested may further be provided, and a radio frequency signature comprising, for each antenna, one or a plurality of values, each representative of an intensity of the waves captured by the antenna, for example, the average intensity or an intensity associated with a predefined frequency, may be determined. Preferably, the antenna(s) are rigidly connected to element 204 cooperating with the circuit to be tested, so that the layout of the antenna(s) and of the tested circuit is not modified during successive tests of various circuits.

One or a plurality of antennas and a reference circuit arranged in any way enabling to capture radio frequency waves transmitted by the reference circuit and to deduce a reference signature therefrom may be used. Further, the reference signature may for example be obtained by digital simulation.

Further, any signal enabling to deduce the reference signature of the radio frequency waves transmitted by the reference circuit may be applied to the reference circuit, for example, any signal having the same frequency spectrum as the signal applied to the tested circuit.

Further, the described embodiments may be adapted to apply one or a plurality of signals of the type of signal 203 to more than two terminals, the tested circuit remaining powered off during the test, that is, no signal applied to possible power supply terminals of the circuit corresponds to a power supply voltage of the circuit.

Finally, although the above-described embodiments of devices are designed to test a single device at a time, a device configured to simultaneously test a plurality of circuits in parallel, by simultaneously applying to the various circuits a signal for example supplied by a same common source, the device for example comprising an antenna or a plurality of antennas for each circuit to be tested, may be formed based on the elements of the present description.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    testing a first circuit, the testing including:
        applying a first signal between two terminals of the first circuit, the first circuit being powered off; and
        verifying whether radio frequency waves transmitted by the first circuit correspond to an expected transmission, wherein the verifying comprises:
        capturing said radio frequency waves simultaneously with applying the first signal;
        deducing a radio frequency signature of the circuit from the radio frequency waves captured; and
        verifying whether said radio frequency signature corresponds to a reference signature, wherein the first signal has a plurality of selected frequencies, and wherein, for each selected frequency:
            the radio frequency signature comprises a respective first value and the reference signature comprises a respective second value; and
            verifying whether said radio frequency signature corresponds to the reference signature comprises comparing with a threshold a difference in absolute value between the respective first value and the respective second value.

2. The method of claim 1, wherein only the first signal is applied to the first circuit during the testing.

3. The method of claim 1, wherein the first signal varies over time.

4. The method of claim 1, wherein the two terminals are power supply terminals configured to receive a DC voltage or of a power supply voltage.

5. The method of claim 1, wherein the first circuit is an integrated circuit comprising a chip in a package.

6. The method of claim 1, wherein the first signal comprises at least one edge.

7. The method of claim 1, wherein, for each selected frequency, the respective first value is representative of an intensity obtained by a bandpass filtering centered on the selected frequency during the step of verifying whether said radio frequency signature corresponds to the reference signature.

8. The method of claim 1, wherein the first signal has a frequency variable over time and, for each selected frequency, the respective first value is representative of an intensity of the first signal at a time when the first signal is at the selected frequency.

9. The method of claim 8, further comprising, before verifying whether said radio frequency signature corresponds to a reference signature:
applying to two terminals of a second circuit a second signal having the selected frequency or plurality of selected frequencies;
capturing radio frequency waves transmitted by the second circuit simultaneously with applying the second signal to the two terminals of the second circuit; and
deducing the second values from the radio frequency waves transmitted by the second circuit.

10. The method of claim 8, further comprising, before verifying whether said radio frequency signature corresponds to a reference signature:
applying to a second circuit a second signal having frequencies covering a frequency range;
capturing radio frequency waves transmitted by the third circuit simultaneously with applying the second signal to the two terminals of the second circuit; and
selecting the selected frequencies among frequencies corresponding to maximum intensity values of the waves captured simultaneously with applying the second signal to the two terminals of the second circuit.

11. A test device, comprising:
a signal source configured to apply a first signal between two terminals of a circuit, the circuit being powered off; and
a radio frequency wave detector configured to verify whether radio frequency waves transmitted by the circuit correspond to an expected transmission, wherein the radio frequency wave detector is configured to:
capture said radio frequency waves simultaneously with the signal source applying the first signal;
deduce a radio frequency signature of the circuit from the radio frequency waves captured; and
verify whether a radio frequency signature corresponds to a reference signature, wherein the first signal has a plurality of selected frequencies, and wherein, for each selected frequency:
the radio frequency signature comprises a respective first value and the reference signature comprises a respective second value; and
the radio frequency wave detector is configured to verify whether the radio frequency signature corresponds to the reference signature comprises by comparing with a threshold a difference in absolute value between the respective first value and the respective second value.

12. The device of claim 11, comprising:
two contact elements connected to the signal source and configured to be in electric contact with said two terminals of the circuit, wherein the radio frequency wave detector includes:
an antenna arranged to capture said radio frequency waves transmitted by the circuit; and
a processing circuit connected to the antenna and configured to verify whether said radio frequency waves transmitted by the circuit correspond to the expected transmission.

13. The device of claim 12, comprising an integrated circuit support comprising the two contact elements.

14. The device of claim 11, wherein the first signal has a selected frequency or a plurality of selected frequencies and the processing circuit comprises, for each selected frequency, a bandpass filtering element according to the selected frequency, the filtering element being connected to the antenna.

15. The device of claim 11, wherein, for each selected frequency, the respective first value is representative of an intensity obtained by a bandpass filtering centered on the selected frequency during the step of verifying whether said radio frequency signature corresponds to the reference signature.

16. The device of claim 11, wherein the first signal has a frequency variable over time and, for each selected frequency, the respective first value is representative of an intensity of the first signal at a time when the first signal is at the selected frequency.

17. A method, comprising testing a first circuit, the testing including:
applying a first signal to a first circuit while the first circuit is off; and
verifying whether radio frequency waves transmitted by the first circuit, in response to applying the first signal, correspond to an expected transmission, wherein:
the verifying comprises:
capturing said radio frequency waves in response to applying the first signal,
deducing a radio frequency signature of the circuit from the radio frequency waves captured, and
verifying whether said radio frequency signature corresponds to a reference signature;
the first signal has a plurality of selected frequencies; and
for each selected frequency:
the radio frequency signature comprises a respective first value and the reference signature comprises a respective second value; and
verifying whether said radio frequency signature corresponds to the reference signature comprises comparing with a threshold a difference in absolute value between the respective first value and the respective second value.

18. The method of claim 17, further comprising, before applying the first signal to the first circuit:
applying to a second circuit, corresponding to the first circuit, a second signal having a plurality of selected frequencies;
capturing radio frequency waves transmitted by the second circuit in response to applying the second signal to the second circuit; and
deducing the second values from the radio frequency waves transmitted by the second circuit.

19. The method of claim 17, wherein, for each selected frequency, the respective first value is representative of an intensity obtained by a bandpass filtering centered on the selected frequency during the step of verifying whether said radio frequency signature corresponds to the reference signature.

20. The method of claim 17, wherein the first signal has a frequency variable over time and, for each selected frequency, the respective first value is representative of an intensity of the first signal at a time when the first signal is at the selected frequency.

* * * * *